United States Patent [19]

Yamazaki et al.

[11] Patent Number: 5,137,201
[45] Date of Patent: Aug. 11, 1992

[54] WIRE BONDING METHOD

[75] Inventors: Nobuto Yamazaki; Kuniyuki Takahashi, both of Tokyo, Japan

[73] Assignee: Kabushiki Kaisha Shinkawa, Tokyo, Japan

[21] Appl. No.: 601,080

[22] Filed: Oct. 23, 1990

[30] Foreign Application Priority Data

Oct. 23, 1989 [JP] Japan .................. 1-275156

[51] Int. Cl.⁵ .......................................... H01L 21/607
[52] U.S. Cl. ...................................... 228/103; 228/179
[58] Field of Search ................. 228/103, 179, 4.5, 7, 228/18, 176

[56] References Cited

U.S. PATENT DOCUMENTS

| | | | |
|---|---|---|---|
| 3,973,713 | 8/1976 | Furuya et al. | 228/7 |
| 4,855,928 | 8/1989 | Yamanaka | 228/4.5 |
| 4,982,728 | 1/1991 | Masuda et al. | 228/4.5 |
| 4,986,460 | 1/1991 | Yamazaki et al. | 228/4.5 |

Primary Examiner—Samuel M. Heinrich
Attorney, Agent, or Firm—Koda and Androlia

[57] ABSTRACT

A wire bonding method that uses plurality of bonders so that each samples treated by the respective bonders are collected via single sample correcting line, in which bonders perform bondings at different points on the samples and/or performs marking bonds at different points thereon, resulting in that the bonder that has performed the bonding can be easily recognized by examining bonding points.

6 Claims, 1 Drawing Sheet

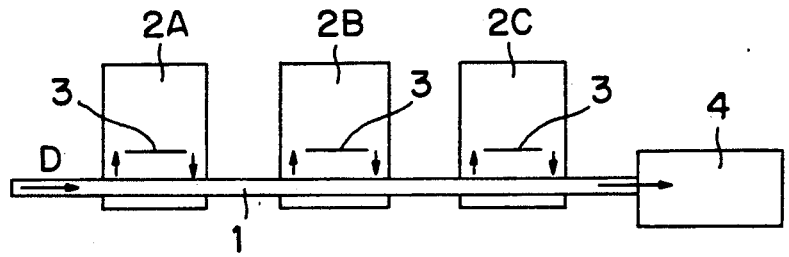
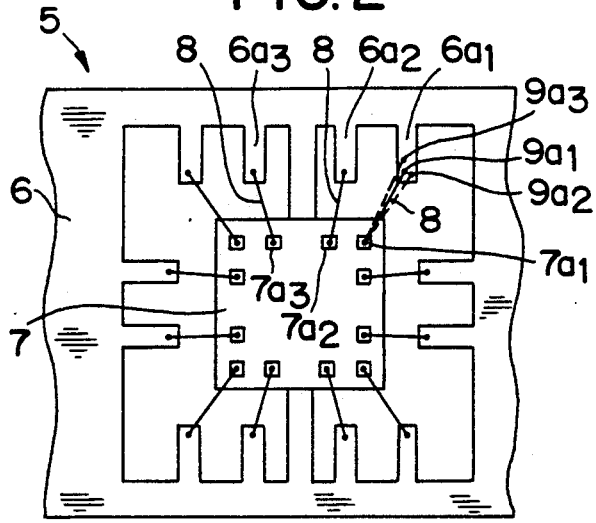
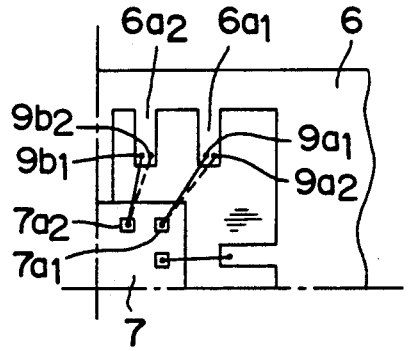
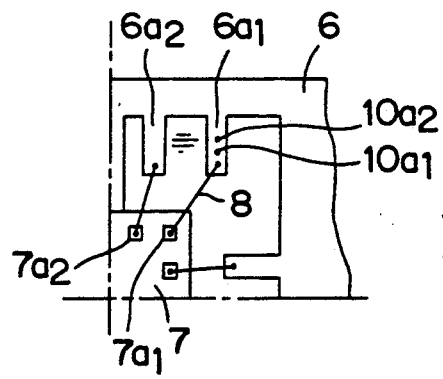
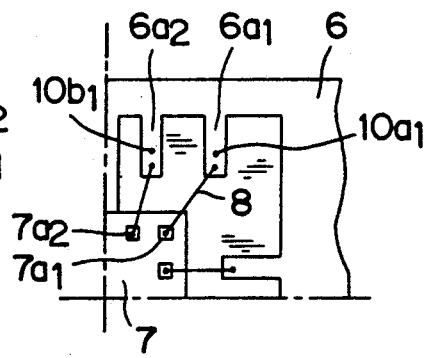

WIRE BONDING METHOD

BACKGROUND OF THE INVENTION

1. Field of the Invention

The present invention relates to a wire bonding method in which samples are treated by a plurality of different wire bonders.

2. Prior Art

One example of conventional wire bonding methods is disclosed in Japanese Patent Publication No. 1-31688. In this art, samples such as lead frames are treated by each of a plurality of wire bonders and then fed into a single sample feeding line so that they are collected in a single sample magazine.

However, in this prior art, no consideration is given to the mutual relationship between each sample and wire bonders. Accordingly, when faulty wire bonding, etc. is found in a subsequent process, there is no way to determine which wire bonder was responsible for such faulty bonding. As a result, handling of faulty bonding tends to be delayed, and the yield drops.

SUMMARY OF THE INVENTION

Accordingly, a primary object of the present invention is to provide a wire bonding method wherein a wire bonder treated a specific sample can be determined without using any special detective devices.

The object of the present invention is accomplished by performing bonding via each of a plurality of bonders at different bonding positions from other bonders or by performing mark bonding to different points on each sample.

The object of the present invention can also be accomplished via several bonders so that wire bonding and mark bonding are performed on different points by each of the bonders so that samples themselves can indicate that by which bonder the bonding has been performed.

Each wire bonder performs bonding at a specific bonding position which is different from other bonders and/or performs mark bonding at different positions from other bonders. Accordingly, by examining positions where the bondings (wire bonding and/or mark bonding) have been performed, it can be easily determined which wire bonder has performed which wire bonding.

BRIEF DESCRIPTION OF THE DRAWINGS

FIG. 1 is an schematic diagram illustrating one example of a sample conveying method using the method of the present invention;

FIGS. 2, 3, 4 and 5 are explanatory diagrams illustrating first through fourth embodiments of the present invention.

DETAILED DESCRIPTION OF THE INVENTION

One embodiment of the present invention will be described with reference to FIGS. 1 and 2:

As shown in FIG. 1, a plurality of wire bonders 2A, 2B and 2C are arranged linearly on one side of a sample feeding line 1.

Samples such as lead frames, etc. which have gone through previous processes or samples which are supplied from supply magazines (not shown) are fed into the feeding line 1 as indicated by arrow D. These samples are picked up by a respective wire bonders 2A through 2C by means of and upon command of loading-/unloading devices 3 installed in each of the wire bonders 2A through 2C. Thus, bonding is performed on each sample by each bonder.

Samples on which bonding has been completed by the respective wire bonders 2A through 2C are returned to the feeding line 1 by the loading/unloading devices 3. Then, the samples are fed by the feeding line 1 and collected by accommodation section 4 such as sample magazine, etc.

In the present invention, the structure and operation of the above system is the same as that of the conventional system. Thus, further detailed description will be omitted.

In the present invention, bonding to samples by each of the wire bonders 2A through 2C is performed as shown in FIG. 2. Each sample 5 consists of chip 7 pasted to a substrate or lead frame 6 (hereafter, both substrates and lead frames will be referred to as "lead frames") and is supplied to one of the wire bonders 2A through 2C. Wires 8 are bonded between the electrodes $7a$ (i.e. $7a_1$, $7a_2$, $7a_3$, ...) of the chip 7 and the leads $6a$ (i.e. $6a_1$, $6a_2$, $6a_3$, ...) of the lead frame 6 by one of the wire bonders 2A through 2C.

When the wire 8 is bonded between the electrode $7a_1$ and lead $6a_1$, such a wire bonding is performed 2A at a point $9a_1$ of the lead $6a_1$ of a lead frame 6 picked up by the bonder 2A. Wire bonding on a sample that is picked up by the bonder 2B is performed at point $9a_2$ of the lead $6a_1$. The point $9a_2$ handled by the bonder 2B is positionally different from the point $9a_1$ at which bonding is performed on the sample treated by the bonder 2A. Similarly, a sample which has been picked up by the bonder 2C is wire bonded at point $9a_3$ on its lead $6a_1$. The bonding point $9a_3$ by the bonder 2C differs from the points $9a_1$ or $9a_2$ which are treated by the bonder 2A or 2B.

In FIG. 2, the dotted line indicates the wire 8 bonded by the bonder 2B, and the two-dot chain line indicates the wire 8 bonded by the bonder 2C. The solid line indicates that the bonding has been done by the bonder 2A. As to the other electrodes ($7a_2$, $7a_3$, ...) and leads ($6a_2$, $6a_3$...), bonders 2A through 2C perform bondings at the same points of the electrodes and leads of the lead frames.

As described above, different bonders perform bondings at different, specified locations, e.g., at points $9a_1$, $9a_2$ and $9a_3$ on the lead $6a_1$ of each sample. Accordingly, when faulty wire bonding is found in a subsequent process, or when faulty wire bonding is uncovered in a spot checking of the samples 5 collected in the collecting section 4, it is easy to tell that which wire bonders 2A through 2C performed which wire bonding by merely examining the positions of points $9a_1$, $9a_2$, $9a_3$ on the particular lead $6a_1$ of the lead frame.

If a substrate has a wire 8 between the electrode $7a_1$ and point $9a_1$, this means that the bonding was performed by bonder A; if one end of the wire 8 is at point $9a_2$, this means the bonding was performed by the bonder $2b$; and so on.

As a result, countermeasures against such faulty bondings can be quickly implemented. Since there is no need to apply distinguishing markings, etc. by special marking devices, there is no increase in the equipment cost.

FIG. 3 illustrates a second embodiment of the present invention. This embodiment is a modification of the embodiment described above.

More specifically, in this embodiment, when the electrode $7a_1$ is connected to the lead $6a_1$, by the wire bonder 2B, such bonding is performed at a point $9a_2$, and this point $9a_2$ is positionally different from point $9a_1$ where the bonding is performed by other bonder 2A or 2C. Also, when the electrode $7a_2$ is connected to the lead $6a_2$, the wire bonder 2C performs such a bonding at a point $9b_2$. This bonding point $9b_2$ is different from point $9b_1$ where the bonding is performed by other wire bonders 2A or 2B. The same effect as that of the embodiment described above can be obtained in this as well.

FIG. 4 illustrates a third embodiment of the present invention. In this embodiment, bonding of the wire 8 between the electrodes 7a (i.e., $7a_1$, $7a_2$, $7a_3$, ... and leads 6a (i.e., $6a_1$, $6a_2$, $6a_3$, ...) is performed at the same bonding points by bonders 2A to 2C. However, to the sample picked up by the bonder 2B, a marking bond $10a_1$ is performed by the bonder 2B on the lead $6a_1$ after the bonder 2B has performed wire bonding between the electrode $7a_1$ and lead $6a_1$. Also, to the sample picked up by the bonder 2C, a marking bond $10a_2$ by the bonder 2C is performed on the lead $6a_1$. The position of the marking bond $10a_2$ is different from the position of the marking bond $10a_1$. The bonder 2A can be programmed so that it either performs marking bond at a point which positionally differs from the points $10a_1$ or $10a_2$ or performs no such marking bond.

By the system described above, it is possible to distinguish which wire bonder (out of bonders 2A through 2C) has performed which wire bonding by merely examining the presence or absence or position of the marking bond. Accordingly, the same effect as that obtained in the embodiments described before is obtainable.

FIG. 5 illustrates a fourth embodiment of the present invention. This embodiment is a modification of the third embodiment.

In the third embodiment, the wire bonder 2A can be programmed so as not to perform marking bond. However, in this fourth embodiment, to the sample picked up by the wire bonder 2B, a marking bond $10a_1$ is performed on the lead $6a_1$, and to the sample picked up by the bonder 2C, a marking bond $10b_1$ by the bonder 2C is performed on the lead $6a_2$. The same effect to that of the embodiments can be obtained in this as well.

It is possible to combine the manners employed in the embodiments described above to execute bonder determination, although such further possible embodiments are not illustrated in the drawings.

In the embodiments described above, the feed line 1 supplies and transfers the samples. However, it goes without saying that the present invention is also applied to an apparatus in which a supply line and discharge line are separately installed.

In the present invention, as is clear from the above description, a wire bonder which has treated specified samples can easily be distinguished from other bonders without a need for any special detection devices. Accordingly, there is no increase in the equipment cost, and countermeasures against defects can be quickly implemented.

We claim:

1. A wire bonding method, in which a plurality of wire bonders respectively, individually perform bonding to a sample supplied thereto and said samples after bonding has been performed thereon by said plurality of bonders are fed into a single feeding line, wherein bonding by each one of said plurality of bonders is performed at a specific location which is different from locations where bondings are performed by other of said plurality of wire bonders.

2. A wire bonding method, in which a plurality of wire bonders respectively, individually perform bonding to a sample supplied thereto and said samples after bonding has been performed thereon are fed into a single feeding line, wherein each of said plurality of wire bonders performs wire bonding at a point which is the same location as points where other bonders perform wire bondings, and then said plurality of wire bonders further perform marking bonds at points which are different from each other.

3. A wire bonding method in which a plurality of wire bonders respectively individually perform bonding to a lead frame supplied thereto so as to connect electrodes of a chip to leads of said lead frame, said method being characterized in that each of said bonders performs wire bonding to a specific point of a respective lead associated with each of said plurality of wire bonders and then performs a marking bond to said respective lead.

4. A wire bonding method according to claim 3, further comprising a step in which after performing wire bonding, each one of said bonders performs a marking bond to points which are different from points where marking bonds are performed by other bonders.

5. A wire bonding method wherein a plurality of wire bonders respectively, individually perform bonding to a sample supplied thereto, and bonding by each one of said plurality of bonders is performed at a specific location which is different from locations where bondings are performed by other of said plurality of wire bonders.

6. A wire bonding method wherein a plurality of wire bonders perform bonding to samples supplied thereto, and each one of said wire bonders performs wire bonding at point which is the same as points where other bonders perform wire bondings, said plurality of wire bonders further performing marking bonds at points which are different from each other.

* * * * *